(12) United States Patent
Tsui

(10) Patent No.: US 6,225,211 B1
(45) Date of Patent: May 1, 2001

(54) METHOD FOR MAKING STACKED AND BORDERLESS VIA STRUCTURES ON SEMICONDUCTOR SUBSTRATES FOR INTEGRATED CIRCUITS

(75) Inventor: Bing-Yue Tsui, Hsinchu (TW)

(73) Assignee: Industrial Technology Research Institute, Hsin-Chu (TW)

( * ) Notice: Subject to any disclaimer, the term of this patent is extended or adjusted under 35 U.S.C. 154(b) by 0 days.

(21) Appl. No.: 09/301,220

(22) Filed: Apr. 29, 1999

(51) Int. Cl.$^7$ .................................................. H01L 21/4763
(52) U.S. Cl. .................................................................. 438/624
(58) Field of Search ........................................ 438/624, 622, 438/626, 631, 633, 634, 637, 644, 700, 706

(56) References Cited

U.S. PATENT DOCUMENTS

| | | | |
|---|---|---|---|
| 4,966,870 | 10/1990 | Barber et al. | 437/228 |
| 5,466,636 | 11/1995 | Cronin et al. | 437/187 |
| 5,792,703 | 8/1998 | Bronner et al. | 438/620 |
| 5,801,094 | 9/1998 | Yew et al. | 438/624 |
| 6,017,817 * | 1/2000 | Chung et al. | 438/637 |
| 6,080,663 * | 6/2000 | Chen et al. | 438/637 |

OTHER PUBLICATIONS

Chang and Sze, "ULSI Technology", The McGraw–Hill Companies, Inc., New York, (1996), pp. 446–447.

\* cited by examiner

Primary Examiner—David Nelms
Assistant Examiner—Quoc Hoang
(74) Attorney, Agent, or Firm—George O. Saile; Stephen B. Ackerman (57) ABSTRACT

A method for making stacked and borderless via structures on multilevel metal interconnections for integrated circuits was achieved. The method involves insulating the devices on a substrate using a planar InterLevel Dielectric (ILD) silicon oxide ($SiO_2$) layer. A first insulating layer is formed in which a patterned first conducting layer is formed by etching trenches and filling with a conducting material that is polished back to be coplanar with the ILD layer. A first etch-stop layer, a second insulating layer, and a second etch-stop layer are deposited. The second etch-stop layer is patterned to form openings over the patterned first conducting layer where via holes are desired. A third insulating layer is deposited and a photoresist mask and plasma etching are used to form trenches in the third insulating layer and extending over the openings to form self-aligned via holes to the underlying conducting layer. After removing the exposed etch-stop layers a second conducting layer is deposited and polished back to form metal lines and via holes. This improved dual-Damascene process results in self-aligned stacked borderless via structures that allow tighter design ground rules.

20 Claims, 10 Drawing Sheets

METHOD FOR MAKING STACKED AND BORDERLESS VIA STRUCTURES ON SEMICONDUCTOR SUBSTRATES FOR INTEGRATED CIRCUITS

BACKGROUND OF THE INVENTION (1) Field of the Invention

The present invention relates to a method for making high-density integrated circuits for ultra large scale integration (ULSI) on semiconductor substrates, and more particularly relates to a method for forming reliable stacked and borderless via structures for multilevel metal interconnections.

(2) Description of the Prior Art

The high density of integrated circuits formed on semiconductor substrates for ULSI requires multilevels of metal interconnections for electrically interconnecting the discrete semiconductor devices on the semiconductor chips. A dielectric layer, usually referred to as the Poly/Metal 1 Dielectric (PMD), is deposited over the field effect transistor (FET) polysilicon gate electrodes and substrate contacts to electrically insulate the devices from the next patterned metal layer. The different levels of metal interconnections are then formed and separated by layers of insulating material, commonly referred to as Interlevel Metal Dielectric (IMD) layers. Both the PMD and IMD layers are commonly referred to as the InterLevel Dielectric (ILD) layers. These interposed dielectric (or insulating) layers have etched contact holes in the PMD layer to the underlying semiconductor devices and vias holes in the IMD layers which are used to electrically connect one level of metal to the next level of metal. The via holes are also commonly referred to as simply vias.

As the circuit is scaled down in ULSI technology to smaller dimensions, one of the most difficult obstacles to continued downscaling is controlling the level-to-level alignment of the photolithography. This is especially a problem in the complex structure of the interconnecting metal and vias as minimum device feature sizes reach 0.18 micrometers. Consequently, the packing density of the metal lines becomes limited by design ground rules governing the separation of the contact holes and/or vias from another level. Specifically, the design rules limit the nesting (stacking) of contact holes or vias in the ILD layer between the various levels of patterned conducting layers.

Figure 1A:
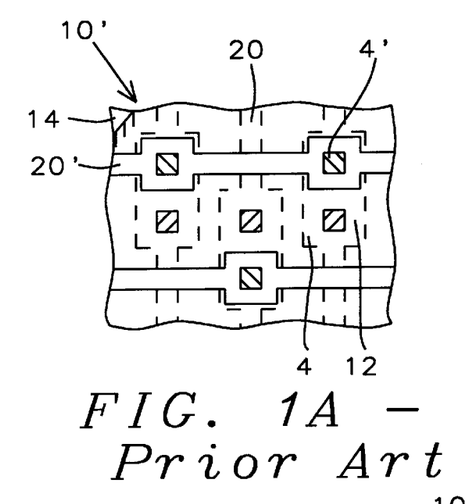
FIGS. 1A through 1E show prior-art schematic top views depicting the advantages of stacked and borderless via structures over via structures having various degrees of borders and stacked vias.
Figure 1B:
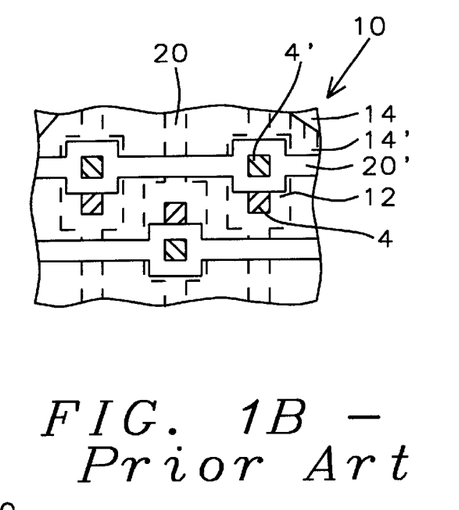
Figure 1C:
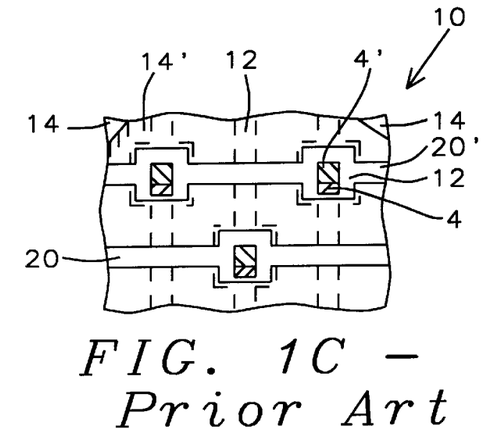
Figure 1D:
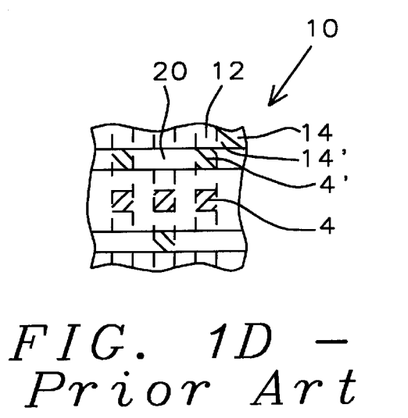
Figure 1E:
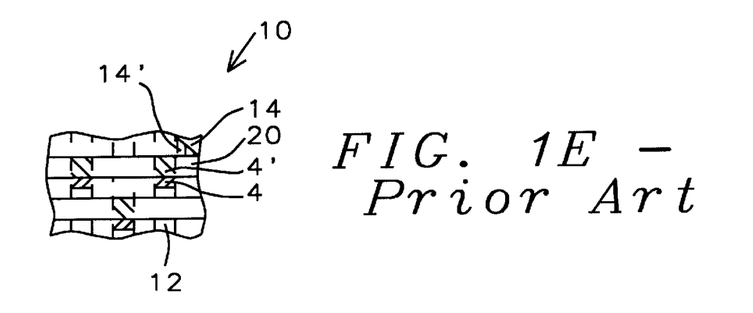

To better appreciate the advantages of using stacked and borderless contact holes and via structures, a sequence of schematic top views for the design layout of two levels of patterned metal and interconnecting vias is shown by the prior art in FIGS. 1A–1D for different design ground rules. In all figures an insulating InterLevel Dielectric (ILD) layer 14 is deposited, and contact holes or vias 4 are etched in the ILD layer 14 to the substrate 10, or to a patterned conducting layer (not shown) on the substrate. A patterned first metal layer 20 is formed on the ILD layer 14 over the vias 4, and a second ILD layer 14' is deposited to insulate the patterned metal layer 20. Vias 4' are etched in ILD layer 14' to the metal layer 20 and a second metal layer 20' is patterned to form the second level of metal interconnections. The metal lines in FIG. 1A have borders (wider metal lines 20 and 20') to accommodate misalignment of the vias 4 and 4', and also the vias are not stacked (one over the other), and therefore require the larger design layout area. The metal lines in FIG. 1B do not require design rule separation between metal lines on different levels for via holes 4 and 4', and require less area. FIG. 1C shows stacked vias with metal borders, FIG. 1D shows borderless vias without via stacking, and FIG. 1E shows stacked and borderless via structures. It is clearly seen from FIG. 1E that the stacked and borderless via structures provide a space-saving advantage, which is a reduction of about 62% in area compared to the structure in FIG. 1A. Therefore, it is very desirable to form stacked and borderless via structures that reduce the total area occupied by the metal interconnections by about 62%. This allows for a substantial increase in the packing density of devices on the semiconductor substrate.

Unfortunately, several processing problems arise when stacked and borderless via structures are fabricated. These process problems are best illustrated by referring to the prior-art schematic cross-sectional views in FIGS. 2A–2D, FIGS. 3A–3C, and FIGS. 4 and 5 showing two-levels of metal having vias.

Figure 2A:
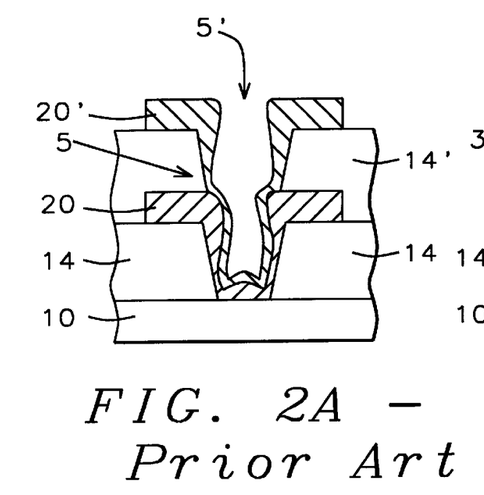
FIGS. 2A through 2D show prior-art schematic cross-sectional views of via structures showing the problems associated with making stacked vias having borders.
Figure 2B:
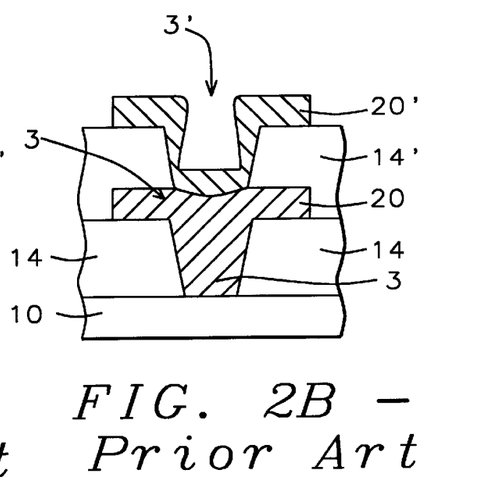
Figure 2C:
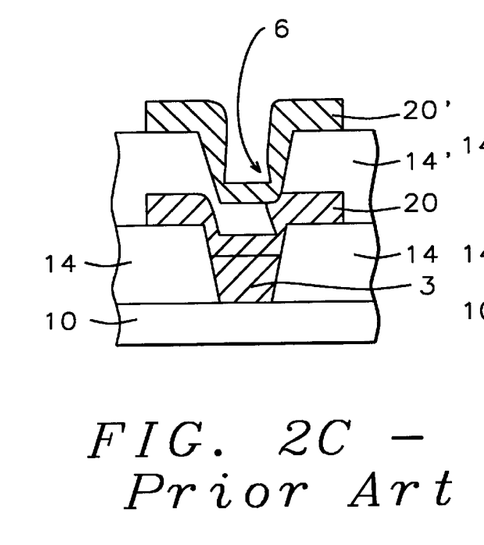
Figure 2D:
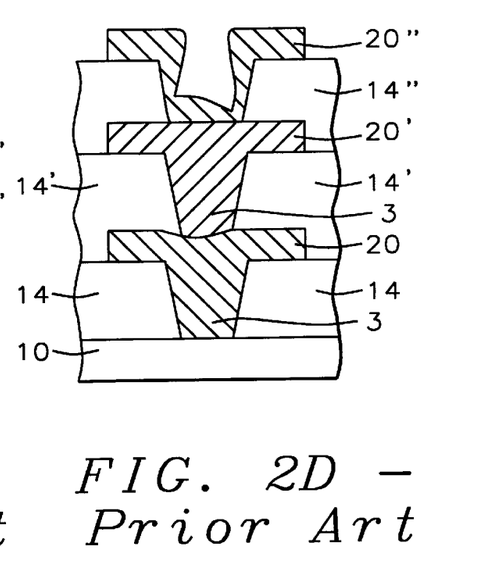
Figure 3:
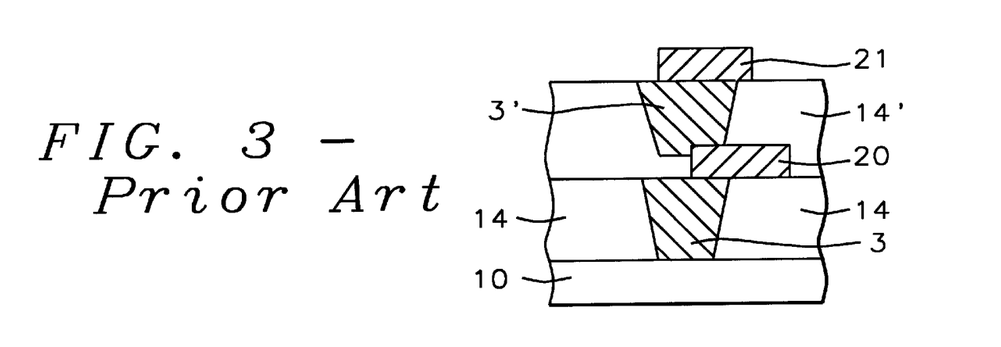
FIG. 3 shows a prior-art schematic cross-sectional view depicting the problems of making stacked and borderless via structures.

FIGS. 2A–2D depict the problems with making stacked vias. In FIG. 2A no metal plug is used in the vias 5' and can result in poor electrical contacts at point 5 causing current-crowding and electromigration of metal atoms, while a good metal plug 3, as in FIG. 2B, ensures good via contacts at 3'. A poorly formed metal plug 3, as in FIG. 2C, can also result in poor via contacts, making contact only at point 6. FIG. 2D shows a three-level metal structure with good metal plugs 3 and good via contacts, but unfortunately requires design rules for metal borders to prevent misalignment, that would otherwise occur, as shown in FIG. 3 when borderless vias are used.

The problem of forming borderless via structures using a conventional dual-Damascene process is best illustrated with reference to FIGS. 4A and 4B.

Figure 4A:
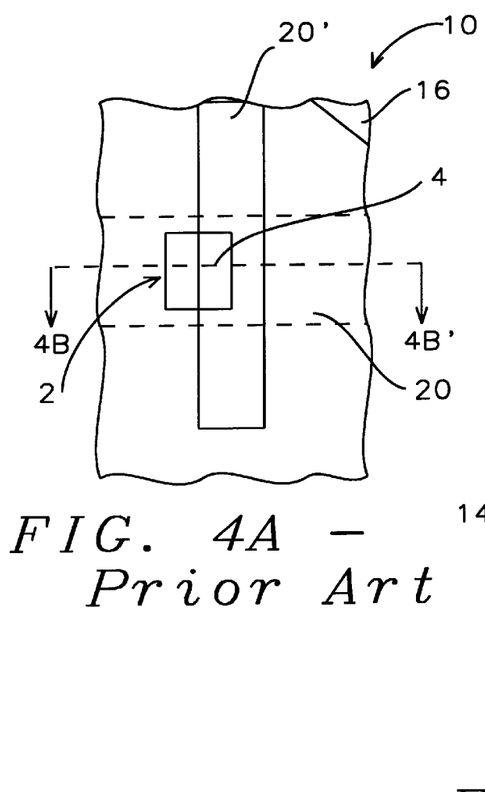
FIG. 4 shows a prior-art schematic cross-sectional view of the problem of misalignment in making borderless vias using conventional etch processes and the dual-Damascene process.
Figure 4B:
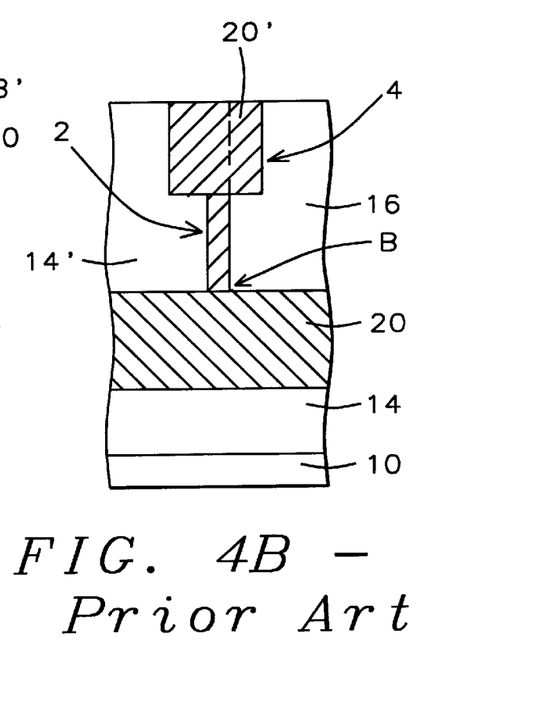

In the conventional dual-Damascene process, as shown in FIGS. 4A and 4B, a trench 4 is partially etched in the ILD layer 16, and a second photoresist mask (not shown) is used to etch the via 2 in layer 16 to the underlying metal 20. The trench 4 and via 2 are filled with metal 20' and etched or polished back by chemical/mechanical polishing (CMP) to the surface of layer 16. However, as shown in the top view of FIG. 4A, when the etched via 2 is misaligned to the trench 4, as occurs in borderless vias, then as shown in the cross sectional view in FIG. 4B, contact area B is very small resulting in high contact resistance. The problem in FIG. 4B is depicted for the cross section through 4B–4B' of FIG. 4. For example, in the 0.18 um technology, the metal line widths are about 0.2 um, and a misalignment of 0.1 um would result in a contact that is only 0.1 um wide.

Various methods of making stacked borderless contacts have been reported in the literature. For example, C. Y. Chang, S. M. Sze in ULSI Technology, McGraw-Hill Co., Inc., 1997, pp. 446–447 discuss the methods and associated problems with making stacked and borderless via structures. See the prior-art structures in FIGS. 1A–1E and 2A–2D. Yew et al. in U.S. Pat. No. 5,801,094 describe a dual-Damascene process using a single etch-stop layer for making trenches and borderless contacts. Another method is described by Bronner et al., U.S. Pat. No. 5,792,703, for making borderless self-aligned electrical contacts to diffused device regions in a substrate, and for making bordered contacts to the self-aligned contacts. Barber et al., U.S. Pat. No. 4,966,870, teach a method for making borderless contacts but do not address the dual-Damascene process. Cronin et al. in U.S. Pat. No. 5,466,636 teach a method for making borderless contacts using a removable mandrel, but do not address the dual-Damascene process.

There is still a strong need in the semiconductor industry for providing a simplified method for forming self-aligned stacked and borderless via structures between the patterned metal levels which are not limited by the design rules.

SUMMARY OF THE INVENTION

It is a principal object of the present invention to provide an improved method for forming stacked and borderless via structures between multilevel metal interconnections.

It is another object of this invention to provide these stacked/borderless via structures utilizing two etch-stop layers, one for etching the vias to the underlying metal lines, while the second etch-stop layer is utilized to concurrently etch trenches having well controlled depths for metal lines, and the trenches are self-aligned to the via holes.

Another object of this invention is to provide a relatively cost-effective manufacturing process for making low-resistance copper lines and via plugs.

In summary, this invention achieves these objectives for making these stacked and borderless via structures for multilevels of interconnections by using two etch-stop layers composed of silicon nitride ($Si_3N_4$).

The invention begins by providing a semiconductor substrate having a partially completed integrated circuit. The most commonly used substrate in the semiconductor industry is composed of single crystal silicon. However, the method is also applicable to other types of substrates where electrical interconnections are desirable. Typically the partially completed semiconductor substrate contains electrically isolated device areas in which the semiconductor devices are formed, such as field effect transistors (FETs), bipolar transistors, and the like, which are formed in part from a patterned conductively doped polysilicon layer or polycide layer (polysilicon with a refractory metal silicide on top). The devices are insulated by a layer commonly referred to as an InterLevel Dielectric (ILD) layer, and more specifically as the Polysilicon/Metal Dielectric (PMD) layer, which is planarized. Contact holes for making electrical contact to the devices are etched in the PMD layer, and the contact holes are filled with conducting plugs. The multilevels of interconnections having these stacked borderless contacts are now formed by the method of this invention as follows:

A patterned first conducting layer is formed on the partially completed substrate and having a planar first insulating layer coplanar with the surface of the patterned first conducting layer. For example, in the current copper interconnect technology, the patterned first conducting layer is formed by depositing a first insulating layer and etching trenches. A barrier/adhesion layer is deposited and copper is deposited or electroplated and is polished back to form copper lines in the trenches.

A blanket first etch-stop layer composed of silicon nitride is deposited on the first insulating layer and also over the patterned copper lines. A second insulating layer, commonly referred to as an intra-via dielectric layer, is deposited on the $Si_3N_4$ first etch-stop layer. Typically the intra-via dielectric layer is a chemical-vapor-deposited silicon oxide (CVD $SiO_2$), although other low-dielectric insulators can also be used to reduce RC time constants. A blanket second etch-stop layer composed of $Si_3N_4$ is deposited on the second insulating layer. The second etch-stop layer is then patterned to form openings over the patterned first conducting layer where via holes are desired. A blanket third insulating layer, such as CVD $SiO_2$, is deposited over the second etch-stop layer and over the openings. A photoresist mask and anisotropic plasma etching are used to selectively etch trenches for conducting lines in the $SiO_2$ third insulating layer to the $Si_3N_4$ second etch-stop layer. During the same etching step the trenches extending over the openings in the second etch-stop layer are etched in the second insulating layer to the first etch-stop layer to form via holes over the patterned first conducting layer. A second plasma etching is carried out to remove selectively the second etch-stop layer in the trenches and the first etch-stop layer in the via holes.

The metal interconnections and via hole contacts are now formed using a dual-Damascene process. A relatively thin blanket barrier layer is conformally deposited on the surfaces of the trenches and the via holes to prevent copper poisoning of device junctions and to improve adhesion. Typically the barrier/adhesion layer is a high-temperature refractory metal or an electrically conducting refractory nitride layer. For example, tantalum, tantalum nitride, or titanium nitride is used as the barrier/adhesion layer. A conformal second conducting layer, such as copper, is deposited to fill the via holes and the trenches. The copper and the barrier layer are chemically/mechanically polishing back to the third insulating layer to form conducting lines in the trenches and to form conducting plugs in the via holes. The copper conducting lines are self-aligned to the copper conducting plugs. The process steps starting with the first etch-stop layer can be repeated for each additional level of electrically conducting interconnections as required to complete the wiring of the integrated circuits on the substrate.

BRIEF DESCRIPTION OF THE DRAWINGS

The objects and other advantages of this invention are best understood with reference to the preferred embodiment when read in conjunction with the following drawings.

DESCRIPTION OF THE PREFERRED EMBODIMENT

The method of the present invention is now described in detail for making improved stacked and borderless via structures in an interlevel dielectric (ILD) layer. The method is identical for making stacked and borderless contacts in both the Polysilicon/Metal Dielectric (PMD) layer to the underlying patterned polysilicon layer and to the substrate, and also for making vias in the intermetal dielectric (IMD) layer between metal layers. Therefore to simplify the discussion, hereafter both will be referred to simply as vias and ILD layers. Although the method is described for only two levels of metal wiring (or between patterned polysilicon layers/substrate and metal lines), it should be well understood by those skilled in the art that the method can be repeated to form additional levels of metal wiring in which stacked vias can be made that further reduce the substrate area on which the integrated circuit is made. Although the metal lines formed are from copper (Cu) for low sheet resistance on future products, aluminum/copper metallurgy can also be used for current product. For either metallurgy, it is common practice in the industry to provide a barrier layer such as tantalum (Ta), Ta nitride ($TaN_x$), or titanium nitride (TiN). The barrier layer prevents the Cu or the Al from penetrating into the silicon substrate.

Figure 5:
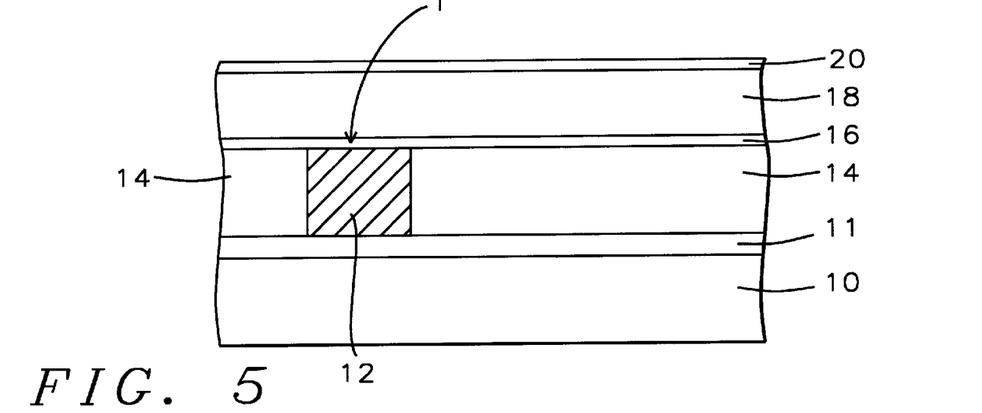
FIGS. 5 through 11 show schematic cross-sectional views for making the improved stacked and borderless via structures of this invention.

Referring now to FIG. 5, a semiconductor substrate 10 is provided on and in which are formed the semiconductor devices, such as FETs and bipolar transistors. The devices are not depicted explicitly to simplify the drawings and discussion. The most commonly used substrate in the semiconductor industry is composed of a single crystal silicon. However, the method is also applicable to other types of substrates where electrical interconnections are desirable. Typically the semiconductor devices are made in part from a conductively doped polysilicon or a polycide layer. For example, the polysilicon can be patterned to form the gate electrodes for FETs, local interconnections, or polysilicon emitter, base, and collector contacts on bipolar devices, and the like.

Next, as shown in FIG. 5, an insulating layer 11, commonly referred to as the InterLevel Dielectric (ILD), is deposited on the substrate to electrically insulate the semiconductor devices (not shown). ILD layer 11 is preferably a silicon oxide ($SiO_2$), or can be a doped silicon oxide (glass) such as a phosphorus glass (PSG) or a boron/phosphorus doped glass (BPSG). Layer 11 is deposited by LPCVD using, for example, tetraethosiloxane (TEOS) and ozone ($O_3$). Layer 11 is then planarized, for example, by chemical/mechanical polishing (CMP), as commonly practiced in the industry. After planarization the thickness of the ILD layer 11 is between about 5000 and 10000 Angstroms over the semiconductor devices.

Still referring to FIG. 5, although not shown in the FIG., contact holes for making electrical contacts to the devices are etched in the PMD layer 11, and are filled with a conducting material to form plugs. The multilevels of interconnections having these stacked borderless contacts are formed next. The method starts by depositing a first insulating layer 14. Layer 14 is preferably a $SiO_2$ and is deposited by chemical vapor deposition (CVD) using, for example, tetraethosiloxane (TEOS) as the reactant gas, and is deposited to a thickness of between about 3000 and 10000 Angstroms. Layer 14 can also be a doped oxide such as borophosphosilicate glass (BPSG) or, for future high-density circuits, a low-dielectric material can be used to reduce capacitance. The first insulating layer 14 is then patterned using a photoresist mask and plasma etching to form trenches 1 for the first level of electrical interconnections. A patterned first conducting layer is formed in the trenches 1 by depositing a relatively thin barrier layer (not shown) followed by depositing a copper layer 12. The barrier layer is preferably Ta/$TaN_x$ deposited by sputter deposition using a Ta target in which nitrogen gas is introduced into the sputtering chamber to form the $TaN_x$. The total thickness of the barrier layer is typically between about 100 and 500 Angstroms. The Cu layer 12 is preferably formed by depositing a Cu seed layer on which Cu is electroplated to a thickness sufficient to fill the trenches 1. The Cu layer 12 and the barrier layer are then chemically-mechanically polished (CMP) back to the insulating layer 14 to form the patterned first conducting layer.

Still referring to FIG. 5, a first etch-stop layer 16 is blanket deposited on the first insulating layer 14 and also over the patterned copper lines. The first etch-stop layer 16 is preferably a low-temperature silicon nitride ($Si_3N_4$) deposited by plasma-enhanced CVD at a temperature of about 300 to 450° C. using silane ($SiH_4$) and ammonia ($NH_3$) as the reactant gas mixture. The preferred thickness of the first etch-stop layer 16 is between about 300 and 1000 Angstroms. Next, a second insulating layer 18, commonly referred to as an intra-via dielectric layer, is deposited on the $Si_3N_4$ first etch-stop layer 16. Typically the intra-via dielectric layer 18 is a CVD $SiO_2$, although other low-dielectric insulators can also be used to reduce RC time constants. The second insulating layer 18 is deposited to a preferred thickness of between about 3000 and 10000 Angstroms.

Continuing with FIG. 5, a second etch-stop layer 20, composed of $Si_3N_4$, is blanket deposited on the second insulating layer 18. The second etch-stop layer 20 is preferably a low-temperature $Si_3N_4$ deposited by plasma-enhanced CVD at a temperature of about 300 to 450° C. using $SiH_4$ and $NH_3$ as the reactant gas mixture. The preferred thickness of the second etch-stop layer 20 is between about 300 and 1000 Angstroms.

Figure 6:
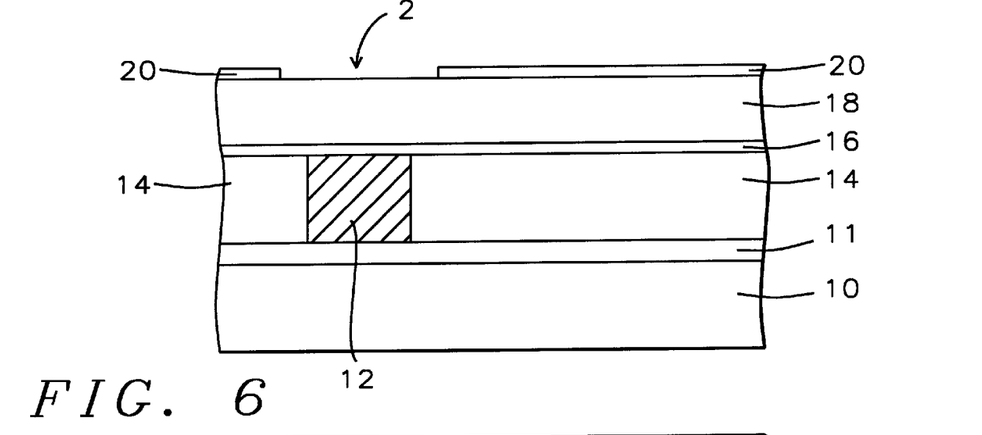

Referring now to FIG. 6, the second etch-stop layer 20 is patterned to form openings 2 over the patterned first conducting layer 12 where via holes are required. The openings 2 are etched in the second etch-stop layer 20 to the second insulating layer 18 using a photoresist mask (not shown) and anisotropic plasma etching. For example, the plasma etching can be carried out using reactive ion etching and a fluorine-containing etchant gas such as $C_2F_6$, $CH_2F_2$, and $C_4F_8$.

Figure 7:
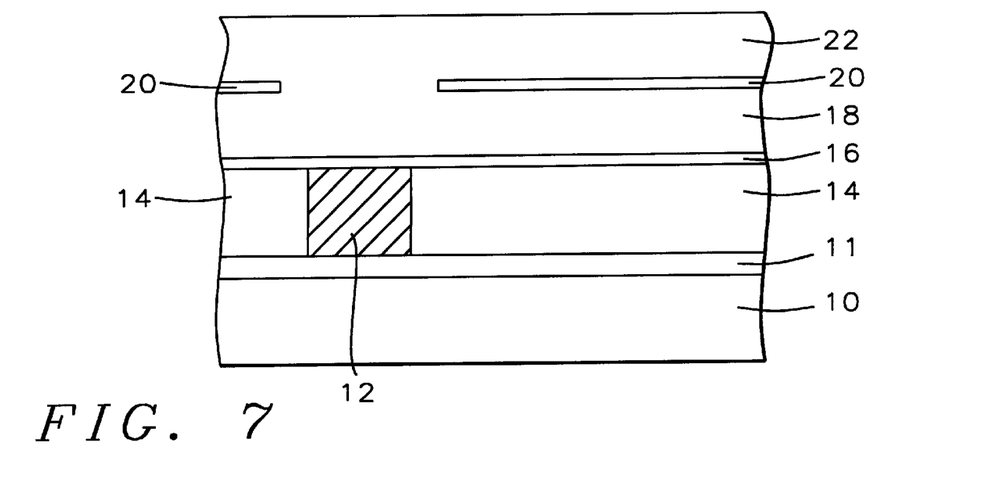

Referring to FIG. 7, a third insulating layer 22, also referred to as an intrametal dielectric layer, is deposited on the $Si_3N_4$ second etch-stop layer 20 and over the openings 2. Typically the intrametal dielectric layer 22 is a CVD $SiO_2$, although other low-dielectric insulators can also be used to reduce RC time constants. The third insulating layer 22 is deposited to a preferred thickness of between about 3000 and 10000 Angstroms.

Figure 8:
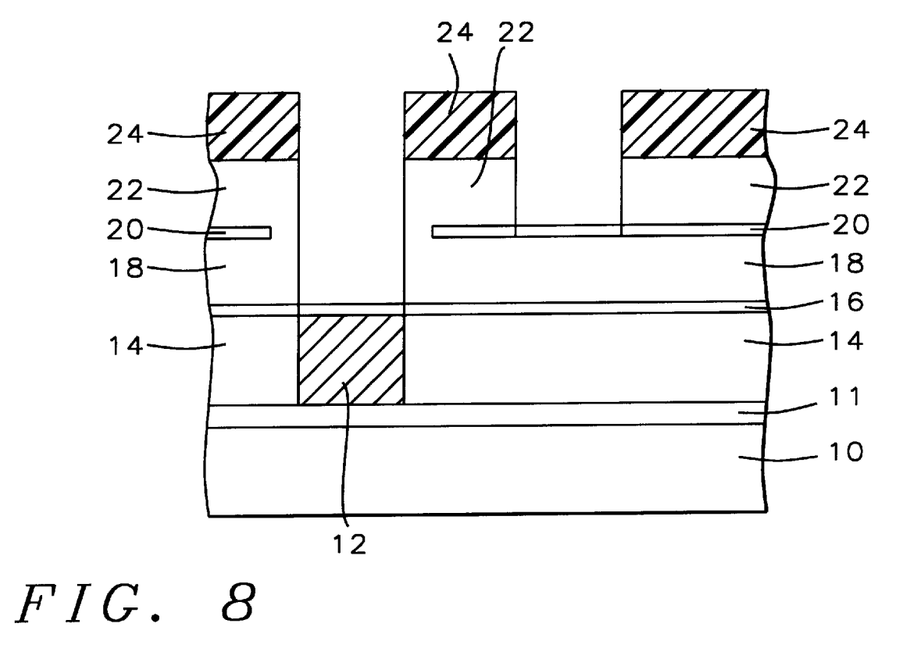

Referring to FIG. 8, a photoresist mask 24 and anisotropic plasma etching are used to selectively etch trenches 4 for conducting lines in the $SiO_2$ third insulating layer 22 to the $Si_3N_4$ second etch-stop layer 20. The depth of the etched trench 4 can be accurately determined by controlling the thickness of the third insulating layer 22, while the first etch-stop layer 16 protects the first conducting layer 12 and the second insulating layer 14 during the etching. During the same etching step, the trenches 4 extending over the openings 2 in the second etch-stop layer 20 are etched in the second insulating layer 18 to the first etch-stop layer 16 to form via holes 4' over the patterned first conducting layer 12.

The etching is carried out using high-density plasma etching that etches the $SiO_2$ insulating layers (22 and 18) selectively to the $Si_3N_4$ etch-stop layers (20 and 16). The etching is preferably carried out having an etch-rate ratio of $SiO_2$ to $Si_3N_4$ of at least greater than 8:1. For example, the etching can be carried out using an etchant gas mixture consisting of $C_2F_6$, $CH_2F_2$, and $C_4F_8$.

Figure 9:
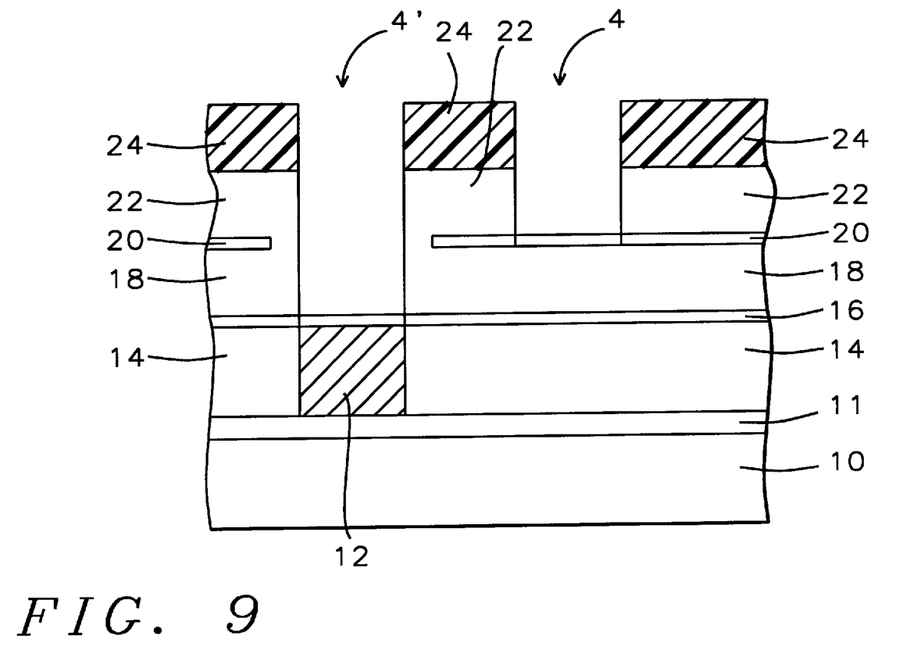

Referring to FIG. 9, a second plasma etching is used to remove selectively the second etch-stop layer 20 in the trenches 4 and the first etch-stop layer 16 in the via holes 4'. The $Si_3N_4$ etch-stop layers are removed using high-density plasma etching and an etchant gas mixture of $C_2F_6$, $CH_2F_2$, and CO, and the photoresist mask 24 is removed using for example plasma ashing in oxygen.

Figure 10:
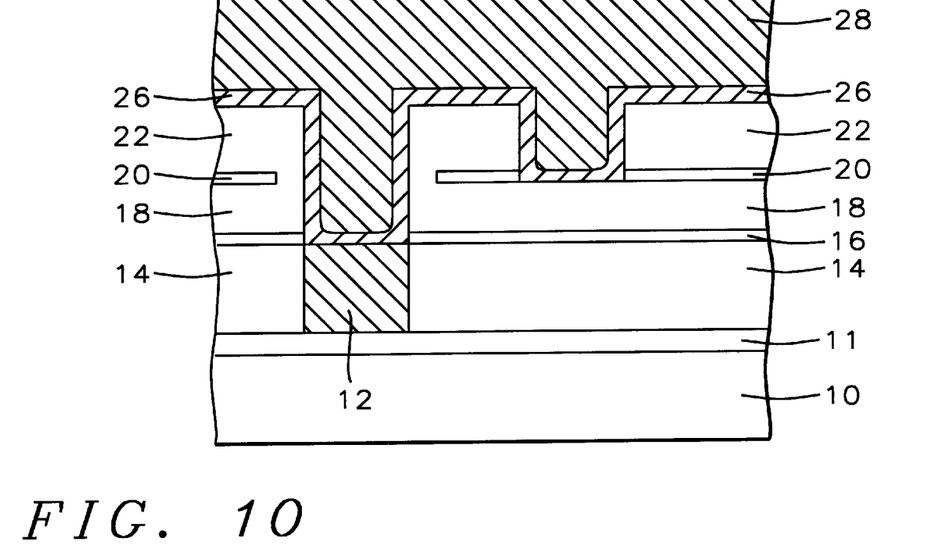

Referring to FIG. 10, this improved dual-Damascene structure is now completed by depositing a barrier/adhesion layer and a second conducting layer, such as Cu, that is CMP back to the surface of the insulating layer 22. The barrier/adhesion layer 26 is preferably a refractory metal, such as Ta or a $TaN_x$ that is conformally deposited on the surfaces of the trenches 4 and the via holes 4' to prevent copper poisoning of device junctions during process and to improve adhesion. Alternatively, if the second conducting layer is Al—Cu, then layer 26 can be Ti and TiN. To provide a conformal layer for these deep via holes and trenches having a high aspect ratio, it is desirable to deposit the Ta by RF sputter deposition in which the metal atoms are ionized, and a negatively biased substrate is used to improve the coverage at the bottom corners of the vias or trenches. The Ta or $TaN_x$ is deposited to a preferred thickness of between about 100 and 500 Angstroms. The $TaN_x$ can also be deposited in the same sputter deposition tool by adding nitrogen during the deposition. A Cu seed layer is deposited next, also by ionizing sputtering techniques to form a continuous layer, and the second conducting layer 28, composed of Cu, is deposited by electroplating to a thickness sufficient to fill the trenches 4 and the vias 4'.

Figure 11:
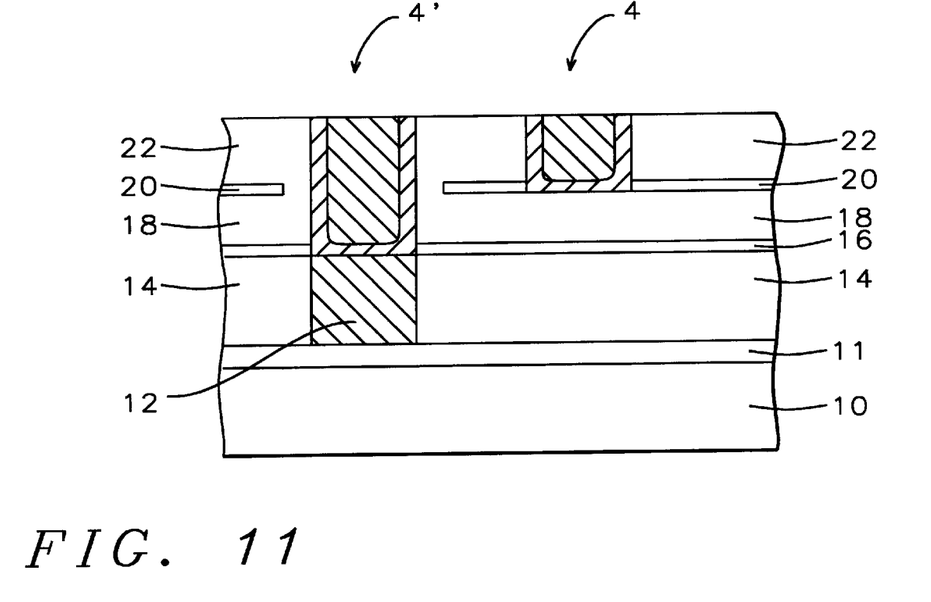

Referring to FIG. 11, the Cu layer 28 and the barrier/adhesion layer 26 are chemically/mechanically polished back to the third insulating layer 22 to form conducting lines 28 in the trenches 4 and to form conducting plugs 28 in the via holes 4'.

The process steps starting with the first etch-stop layer 16 (FIG. 5) can be repeated for each additional level of electrically conducting interconnections as required to complete the wiring of the integrated circuits on the substrate.

To better appreciate the advantages of this invention, several layout schemes for making these stacked borderless via structures are depicted in FIGS. 12A through 15B. The FIGS. are depicted for the process step shown in FIG. 8 prior to depositing and polishing back the second conducting layer for filling the trenches and via holes.

Figure 12A:
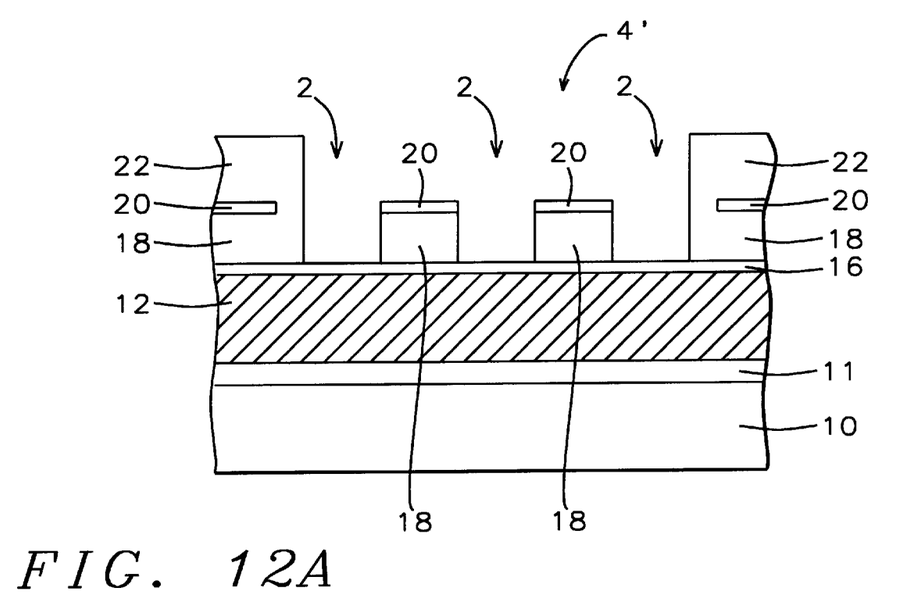
FIG. 12A shows a side view of a multiple via hole structure for reducing contact resistance by the method of this invention.
Figure 12B:
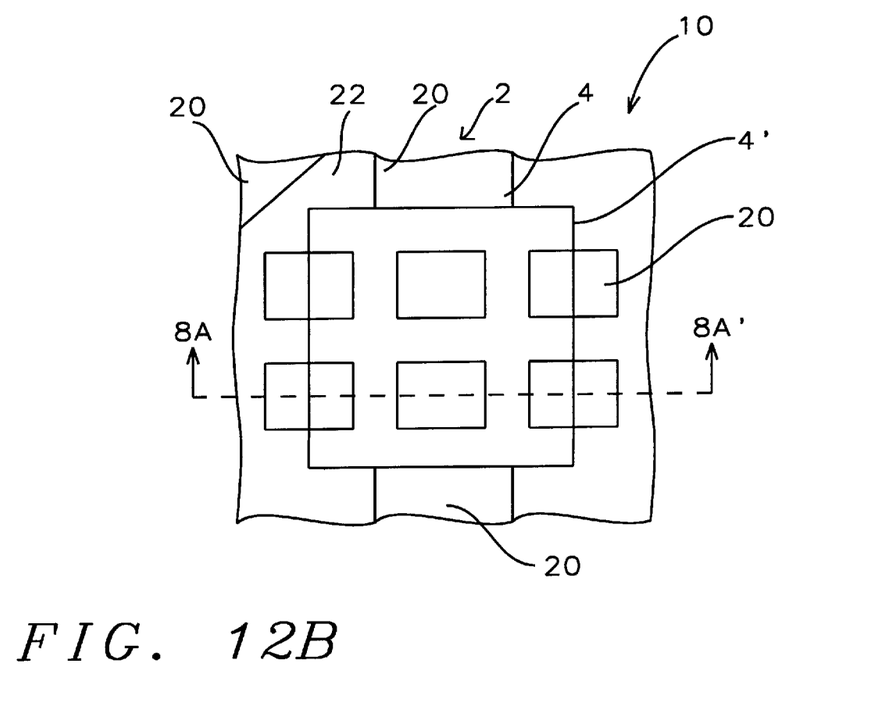
FIG. 12B shows a top view of the multiple via hole structure of FIG. 12A.

FIGS. 12A and 12B show a multiple via-hole structure for reducing the contact resistance. FIG. 12B shows a top view in which the second etch-stop layer 20 is patterned to form a grid pattern for increasing the contact area for the via holes, while leaving portions of the etch-stop layer 20 to mask the $SiO_2$ layer 18, as shown in FIG. 12B. The photoresist pattern 24 (see FIG. 8) for the trench 4 is then patterned to form the via-hole opening 4' in the second insulating layer 18 over the grid area, while the $Si_3N_4$ mask 20 prevents etching. FIG. 12A shows the cross section through 8A–8A' of FIG. 12B. This results in reduced contact resistance, while the closely spaced portions of the $SiO_2$ layer 18 allow for improved planarization of the metal over the via holes 41 without dishing during CMP. The trench 4 is also self-aligned to the via hole 4'.

Figure 13A:
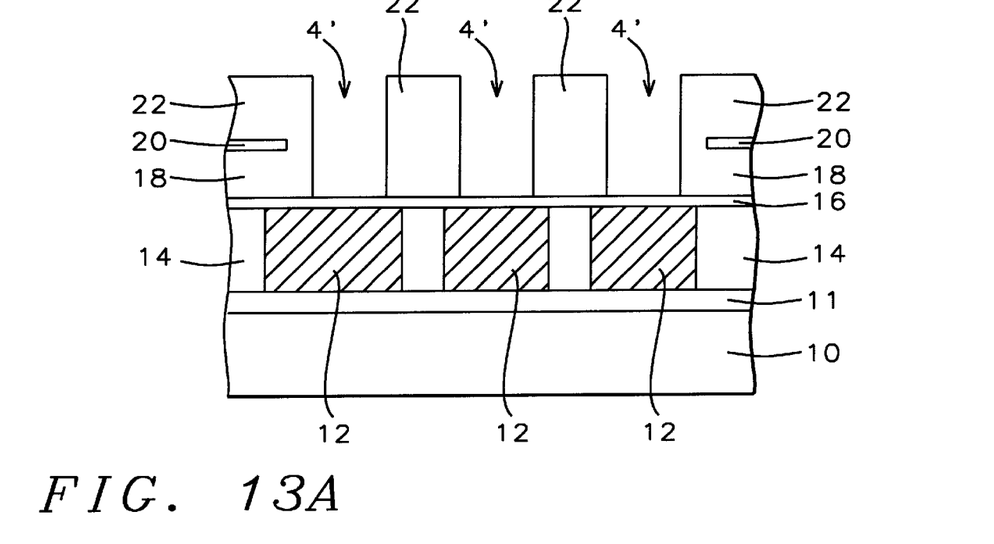
FIG. 13A shows a side view of a multiple trench structure having adjacent via holes that are self-aligned to the trenches.
Figure 13B:
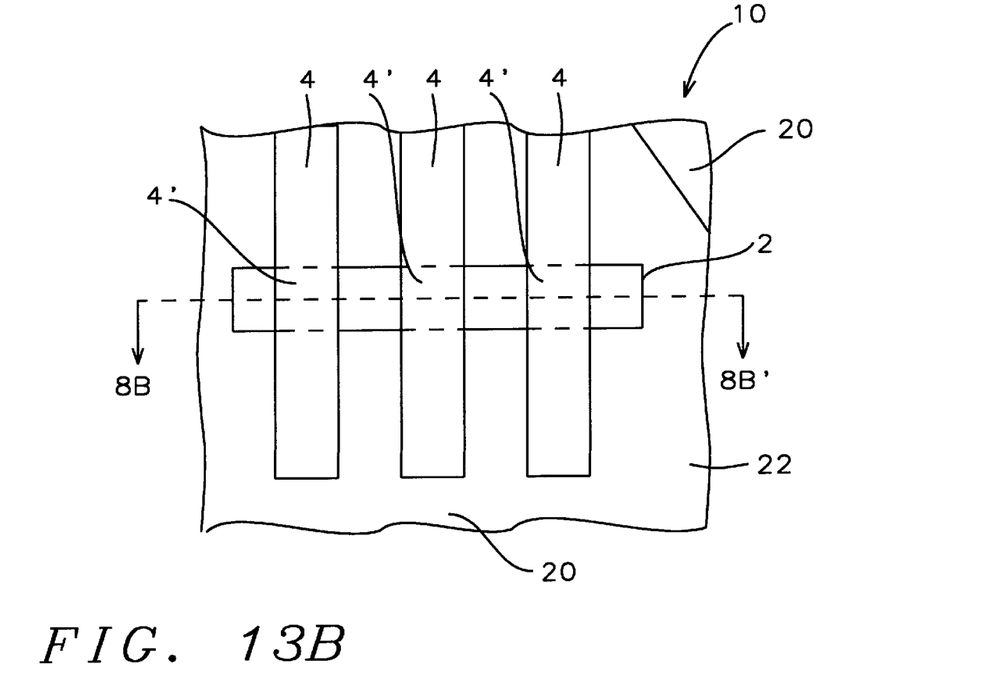
FIG. 13B shows a top view of the multiple trench structure of FIG. 13A.

FIG. 13B shows a top view in which an opening 2 is formed in the second etch-stop layer 20 for making an array of closely spaced via holes having minimum design ground rules for adjacent metal lines. After forming the opening 2 (FIG. 13B), the photoresist mask 24 for etching the trenches (see FIG. 8) is patterned to form the trenches 4 in the third insulating layer 22 over the opening 2, while etching the second insulating layer 18 to the underlying conducting layer 12. This results in self-aligned via holes as shown in FIG. 13A for the cross section 8B–8B' of FIG. 13B.

Figure 14A:
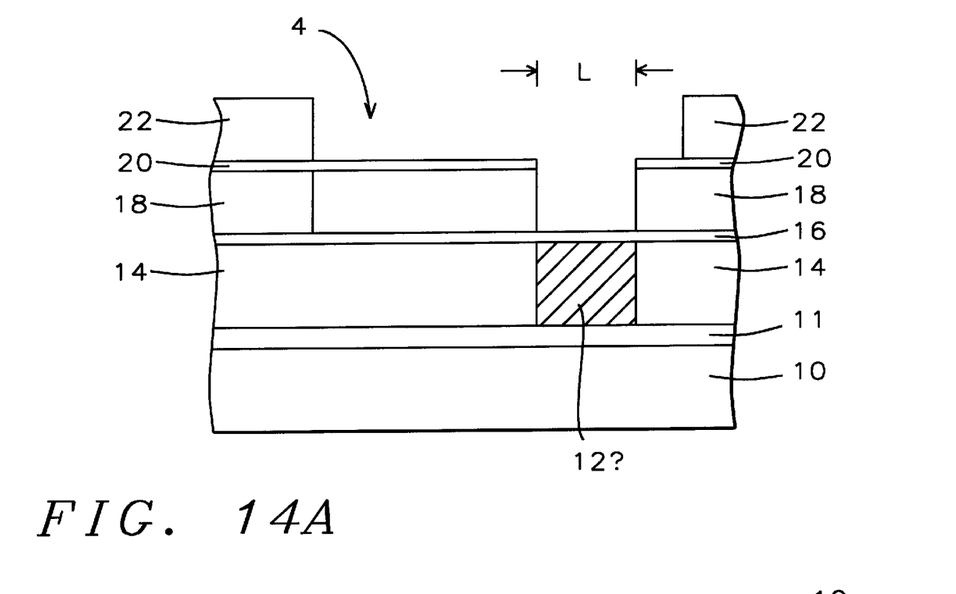
FIG. 14A shows a cross-sectional view of a trench over a single via hole.
Figure 14B:
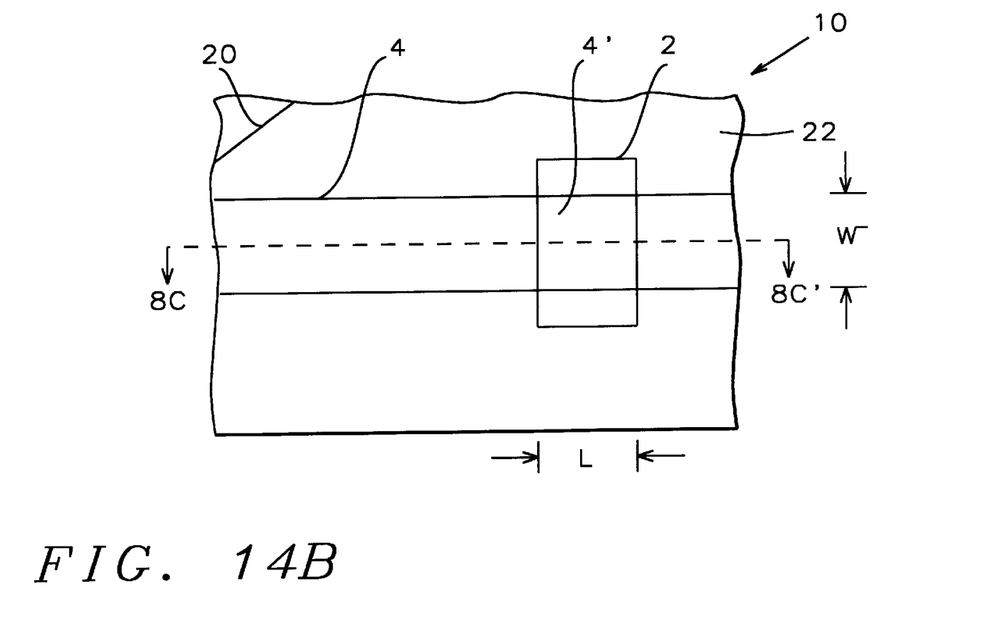
FIG. 14B shows a top view of the structure of FIG. 14A.

FIG. 14B shows a top view of a single via hole 4' self-aligned to a single trench 4. After forming the openings 2 in the second etch-stop layer 20, the trench 4 is etched in the third insulating layer 22 extending over the opening 2, while concurrently etching the second insulating layer 18 to the first conducting layer 12. This results in a via hole 4' which is self-aligned to the trench 4 and both having a width W. The length L of the via hole along the trench 4 is determined by the opening 2 in the second etch-stop layer 20. FIG. 14A shows a cross section 8C–8C' through the trench 4 and the via hole 4' of FIG. 14B.

Figure 15A:
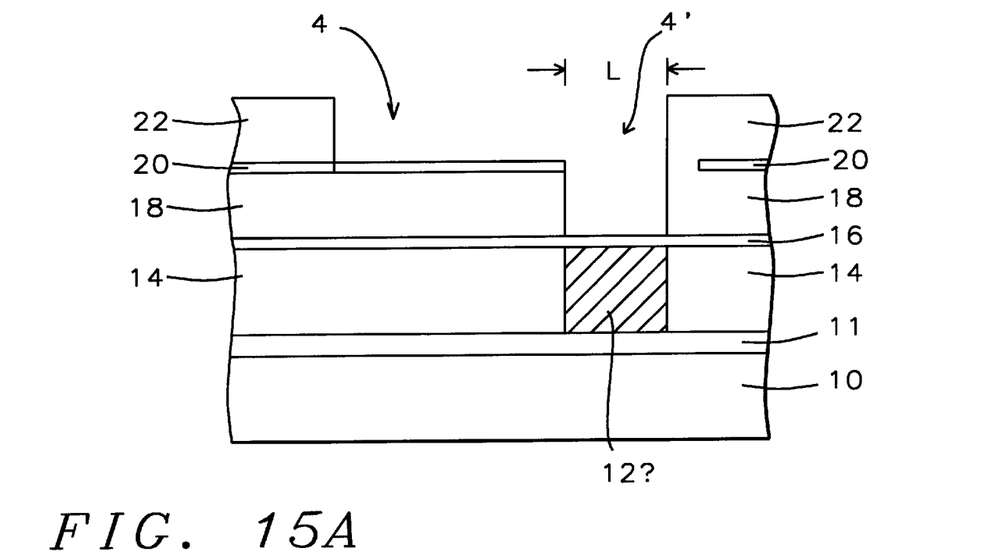
FIG. 15A shows a cross-sectional view at the corner of a trench over a single via hole.
Figure 15B:
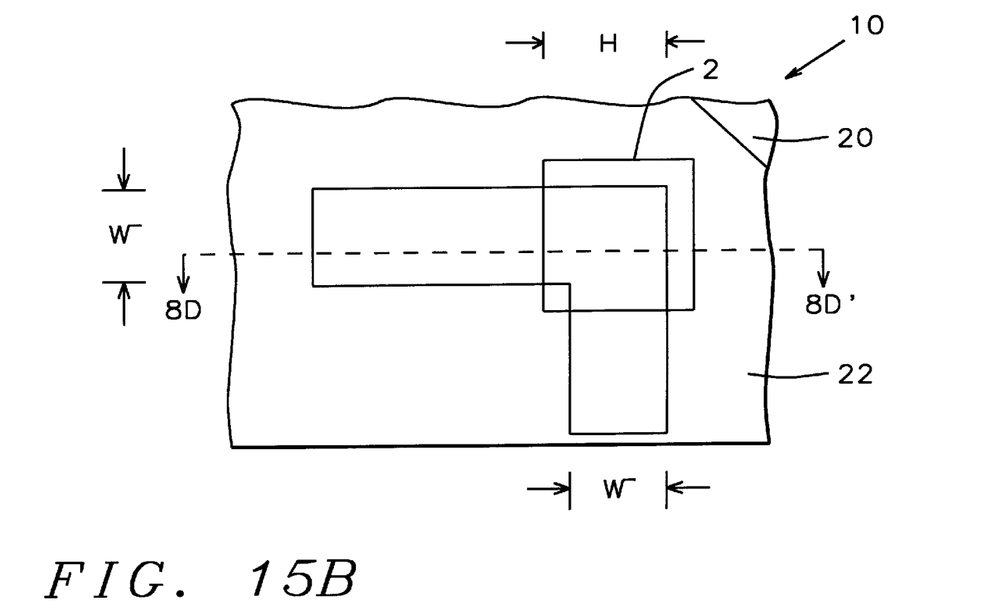
FIG. 15B shows a top view of the trench having a right-angle corner over a single via hole structure of FIG. 15A.

FIG. 15B shows a top view of a single via hole 4' self-aligned to a single trench 4 at the corner of the trench. After forming the openings 2 in the second etch-stop layer 20, the trench 4 is etched in the third insulating layer 22 with its corner extending over the opening 2. Concurrently the second insulating layer 18 is etched to the first conducting layer 12 in the opening 2. This results in a via hole 4' which is self-aligned to the trench 4 and both having a width W. The length L of the via hole along the trench 4 is determined by the opening 2 in the second etch-stop layer 20. FIG. 15A shows a cross section 8D–8D' through the trench 4 and the via hole 4' of FIG. 15B.

While the invention has been particularly shown and described with reference to the preferred embodiment thereof, it will be understood by those skilled in the art that various changes in form and details may be made without departing from the spirit and scope of the invention.

What is claimed is:

1. A method for making stacked and borderless via structures for multilevels of electrically conducting interconnections for integrated circuits comprising the steps of:

a) providing a semiconductor substrate having semiconductor devices formed in and on said substrate and having a patterned first conducting layer formed thereon and having a planar first insulating layer coplanar with surface of said patterned first conducting layer;

b) depositing a blanket first etch-stop layer on said first insulating layer;

c) depositing a second insulating layer on said first etch-stop layer;

d) depositing a blanket second etch-stop layer on said second insulating layer;

e) patterning said second etch-stop layer and having openings over said patterned first conducting layer where via holes are desired;

f) depositing a blanket third insulating layer over said second etch-stop layer and over said openings;

g) using a photoresist mask and anisotropic plasma etching to etch trenches for conducting lines in said third insulating layer to said second etch-stop layer, while said trenches extending over said openings in said second etch-stop layer are concurrently etched in said second insulating layer to said first etch-stop layer over said patterned first conducting layer to form via holes;

h) removing selectively said second etch-stop layer in said trenches and said first etch-stop layer in said via holes;

i) depositing a blanket conformal barrier layer on surface of said trenches and said via holes;

j) depositing a conformal second conducting layer and filling said vias and said trenches;

k) chemically/mechanically polishing back said second conformal conducting layer and said barrier layer to said third insulating layer to form conducting lines in said trenches and to form conducting plugs in said via holes, said conducting lines self-aligned to said conducting plugs;

l) repeating steps b) through k) for each additional level of electrically conducting interconnections as required to complete the wiring of said integrated circuits.

2. The method of claim 1, wherein said first and said second conducing layers are copper and are deposited to a thickness of between about 3000 and 10000 Angstroms.

3. The method of claim 1, wherein said first and said second conducing layers are aluminum/copper alloy and are deposited to a thickness of between about 3000 and 10000 Angstroms.

4. The method of claim 1, wherein said first etch-stop layer is silicon nitride and is deposited to a thickness of between about 300 and 1000 Angstroms.

5. The method of claim 1, wherein said second and said third insulating layers are silicon oxide and are deposited to a thickness of between about 3000 and 10000 Angstroms.

6. The method of claim 1, wherein said second and said third insulating layers are low-dielectric constant insulators and are deposited to a thickness of between about 3000 and 10000 Angstroms.

7. The method of claim 1, wherein said second etch-stop layer is silicon nitride and is deposited to a thickness of between about 300 and 1000 Angstroms.

8. The method of claim 1, wherein said anisotropic plasma etching of said third insulating layer and said second insulating layer to said etch-stop layers has an etch-rate ratio of at least greater than 8:1.

9. The method of claim 1, wherein said conformal barrier layer is a material selected from the group that includes tantalum nitride, titanium nitride, and tantalum.

10. The method of claim 1, wherein said conformal barrier layer is deposited to a thickness of between about 100 and 500 Angstroms.

11. A method for making stacked and borderless via structures for multilevels of electrically conducting interconnections for integrated circuits comprising the steps of:

a) providing a semiconductor substrate having semiconductor devices formed in and on said substrate and having a patterned first conducting layer formed thereon and having a planar first insulating layer coplanar with surface of said patterned first conducting layer;

b) depositing a blanket silicon nitride first etch-stop layer on said first insulating layer;

c) depositing a second insulating layer on said first etch-stop layer;

d) depositing a blanket silicon nitride second etch-stop layer on said second insulating layer;

e) patterning said second etch-stop layer and having openings over said patterned first conducting layer where via holes are desired;

f) depositing a blanket third insulating layer over said second etch-stop layer and over said openings;

g) using a photoresist mask and anisotropic plasma etching to etch trenches for conducting lines in said third insulating layer to said second etch-stop layer, while said trenches extending over said openings in said second etch-stop layer are concurrently etched in said second insulating layer to said first etch-stop layer over said patterned first conducting layer to form via holes;

h) removing selectively said second etch-stop layer in said trenches and said first etch-stop layer in said via holes;

i) depositing a blanket conformal barrier layer on surface of said trenches and said via holes;

j) depositing a conformal second conducting layer and filling said vias and said trenches;

k) chemically/mechanically polishing back said second conformal conducting layer and said barrier layer to said third insulating layer to form conducting lines in said trenches and to form conducting plugs in said via holes, said conducting lines self-aligned to said conducting plugs;

l) repeating steps b) through k) for each additional level of electrically conducting interconnections as required to complete the wiring of said integrated circuits.

12. The method of claim 11, wherein said first and said second conducing layers are copper and are deposited to a thickness of between about 3000 and 10000 Angstroms.

13. The method of claim 11, wherein said first and said second conducing layers are aluminum/copper alloy and are deposited to a thickness of between about 3000 and 10000 Angstroms.

14. The method of claim 11, wherein said first etch-stop layer is deposited to a thickness of between about 300 and 1000 Angstroms.

15. The method of claim 11, wherein said second and said third insulating layers are silicon oxide and are deposited to a thickness of between about 3000 and 10000 Angstroms.

16. The method of claim 11, wherein said second and said third insulating layers are low-dielectric constant insulators and are deposited to a thickness of between about 3000 and 10000 Angstroms.

17. The method of claim 11, wherein said second etch-stop layer is deposited to a thickness of between about 300 and 1000 Angstroms.

18. The method of claim 11, wherein said anisotropic plasma etching of said third insulating layer and said second insulating layer to said etch-stop layers has an etch-rate ratio of at least greater than 8:1.

19. The method of claim 11, wherein said conformal barrier layer is a material selected from the group that includes tantalum nitride, titanium nitride, and tantalum.

20. The method of claim 11, wherein said conformal barrier layer is deposited to a thickness of between about 100 and 500 Angstroms.

* * * * *